United States Patent
Sunderland et al.

(10) Patent No.: US 12,202,369 B2
(45) Date of Patent: Jan. 21, 2025

(54) INTEGRATED METER IN AN ELECTRIC VEHICLE SUPPLY EQUIPMENT (EVSE)

(71) Applicant: ChargePoint, Inc., Campbell, CA (US)

(72) Inventors: David R. Sunderland, Swindon (GB); Ivan Baranov, San Francisco, CA (US)

(73) Assignee: CHARGEPOINT, INC., Campbell, CA (US)

( * ) Notice: Subject to any disclaimer, the term of this patent is extended or adjusted under 35 U.S.C. 154(b) by 0 days.

(21) Appl. No.: 18/443,198

(22) Filed: Feb. 15, 2024

(65) Prior Publication Data
US 2024/0278672 A1    Aug. 22, 2024

Related U.S. Application Data

(60) Provisional application No. 63/485,495, filed on Feb. 16, 2023.

(51) Int. Cl.
*B60L 53/62* (2019.01)
*G01R 22/06* (2006.01)

(52) U.S. Cl.
CPC ............ *B60L 53/62* (2019.02); *G01R 22/065* (2013.01)

(58) Field of Classification Search
CPC .................. B60L 53/60–66; G01R 22/06–068
See application file for complete search history.

(56) References Cited

U.S. PATENT DOCUMENTS

| | | | |
|---|---|---|---|
| 2013/0067253 A1* | 3/2013 | Tsuda | H02J 13/00028 713/300 |
| 2016/0193931 A1 | 7/2016 | Adachi et al. | |
| 2016/0200213 A1* | 7/2016 | Wolf | G01R 31/396 903/907 |
| 2017/0088001 A1* | 3/2017 | Haas | B60L 53/64 |
| 2018/0086213 A1* | 3/2018 | Jefferies | H01R 31/065 |
| 2022/0089055 A1 | 3/2022 | Tenhouten et al. | |
| 2022/0185136 A1* | 6/2022 | Reineccius | B60L 53/63 |

(Continued)

OTHER PUBLICATIONS

"Directive 2014/32/EY of the European Parliament and of the Council", Official Journal of the European Union, Feb. 26, 2014, pp. 149-250.

(Continued)

*Primary Examiner* — Huy Q Phan
*Assistant Examiner* — David B Frederiksen
(74) *Attorney, Agent, or Firm* — NICHOLSON DE VOS WEBSTER & ELLIOTT LLP

(57) ABSTRACT

An integrated meter in an electric vehicle supply equipment (EVSE) is described. Input power is received at input terminal of the EVSE and carried through a conductor that passes through an opening of a current transformer coil of the meter. The input power is split into a main path and an auxiliary path. The main path is for charging an electric vehicle (EV). The auxiliary path provides power to the meter to the EVSE itself. The auxiliary path passes through the opening of the current transformation coil in a reverse direction before being passed to a power supply of the meter and to a power supply of the EVSE to remove any current not for charging the EV from current measurements. The meter calculates energy measurements that do not include current drawn by the meter and the EVSE and transmits them to a processor of the EVSE.

20 Claims, 15 Drawing Sheets

(56) References Cited

U.S. PATENT DOCUMENTS

2022/0187343 A1\* 6/2022 Gabrielsson ......... G01R 15/185
2022/0305936 A1 9/2022 Koolen

OTHER PUBLICATIONS

"Products for Electric Vehicle Charging Stations", Version 2.0, Iskra.eu, Oct. 2022, 9 pages.
International Search Report and Written Opinion, PCT App. No. PCT/US2024/016263, Jun. 19, 2024, 13 pages.

\* cited by examiner

INTEGRATED METER IN AN ELECTRIC VEHICLE SUPPLY EQUIPMENT (EVSE)

CROSS-REFERENCE TO RELATED APPLICATIONS

This application claims the benefit of U.S. Provisional Application No. 63/485,495, filed Feb. 16, 2023, which is hereby incorporated by reference.

FIELD

Embodiments of the invention relate to the field of electric vehicle supply equipment (EVSE); and more specifically, to an integrated meter in an EVSE.

BACKGROUND

Electric vehicle charging stations, sometimes referred to as EVSE, are used to charge electric vehicles (e.g., electric battery powered vehicles, gasoline/electric battery powered vehicle hybrid, etc.). An EVSE commonly includes a switchable relay to control charge transfer for an electric vehicle. Some EVSEs include a measuring device to measure current, voltage, power, power factor, and/or energy accumulation. Such a measuring device is sometimes referred to as a meter.

Meters may be required to be compliant with certain directives or standards. An example of such a directive is the Measuring Instruments Directive (MID) 2014/32/EU. A meter included in an EVSE in the European Union may need to be approved as MID compliant. A conventional EVSE that requires MID compliant metering typically uses one of the following implementations. One approach is to use a MID compliant meter that is typically DIN rail mounted and connected through the main wiring either upstream of the product or within the housing of the product. Another approach is to submit the entire EVSE for MID compliance approval.

SUMMARY

An integrated meter in an electric vehicle supply equipment (EVSE) is described. In one aspect, the integrated meter can be used for calculating energy measurements for charging an electric vehicle. Input power is received at input terminals of the EVSE and carried through a conductor that passes through an opening of a current transformer coil of the meter. The input power is split into a main path and an auxiliary path. The main path is for charging an electric vehicle (EV). The auxiliary path provides power to the meter to the EVSE itself. The auxiliary path passes through the opening of the current transformation coil in a reverse direction before being passed to a power supply of the meter and to a power supply of the EVSE to remove any current not for charging the EV from current measurements. The meter calculates energy measurements that do not include current drawn by the meter and the EVSE and transmits them to a processor of the EVSE.

In another aspect, the integrated meter can be used for calculating energy measurements in a vehicle-to-grid (V2G) environment where energy is transferred from an electric vehicle to the grid. Input power is received from an electric vehicle and carried through a conductor that passes through an opening of a current transformer coil of the meter. A first part of the power path is for providing power to the grid (V2G). A second part of the power path provides power to the meter and the EVSE itself. The second part of the power path passes through the opening of the current transformation coil before being passed to a power supply of the meter and to a power supply of the EVSE. The meter calculates energy measurements that include the power sourced from the electric vehicle. The power used by the EVSE and the meter is not subtracted from these measurements.

BRIEF DESCRIPTION OF THE DRAWINGS

The invention may best be understood by referring to the following description and accompanying drawings that are used to illustrate embodiments of the invention. In the drawings.

DESCRIPTION OF EMBODIMENTS

An EVSE that includes an integrated meter is described. The meter is assembled into the EVSE without any manual wired connections. Current for charging an electric vehicle (EV) passes through openings within the meter without being electrically connected to the meter. Low power mains AC data connections are made through connection terminals between the meter and the circuit board within the EVSE. The meter may be used for bidirectional metering (power to an EV, and power from an EV).

The meter is in a location within the circuitry of the EVSE such that the power for the EVSE, meter, and for charging an EV (or from the EV), runs through current coil(s) of the meter. To account for only the current being drawn by the electric vehicle, the meter includes an auxiliary loop that runs backwards through the current coil(s) and then to the power supply of the meter and the power supply of the EVSE. This allows for any non-EV current to be removed from the meter measurements. All power required for the internal power supply of the meter and for the power supplied to an auxiliary power output on the meter are passed through this auxiliary loop. The auxiliary power output is used to power the functions of the EVSE. The auxiliary power pin may be enclosed within the secured housing of the EVSE to prevent abuse.

Unlike conventional off the shelf meters that are DIN rail mounted that require manual wired connections, the meter described herein does not require a manual wired connection. Assembly is therefore easier and faster compared to these conventional meters. Further, the meter may be submitted for approval or compliance independently of the EVSE. Once approved, it can be assembled into the EVSE. This reduces the complexity of the approval process as compared to approving the full EVSE. For instance, if the full EVSE must be submitted for approval, it may be required to be manufactured in an approved facility. Further, the complete unit may require extensive end of line testing where any failures can cause the entire product to be reworked.

Figure 1:
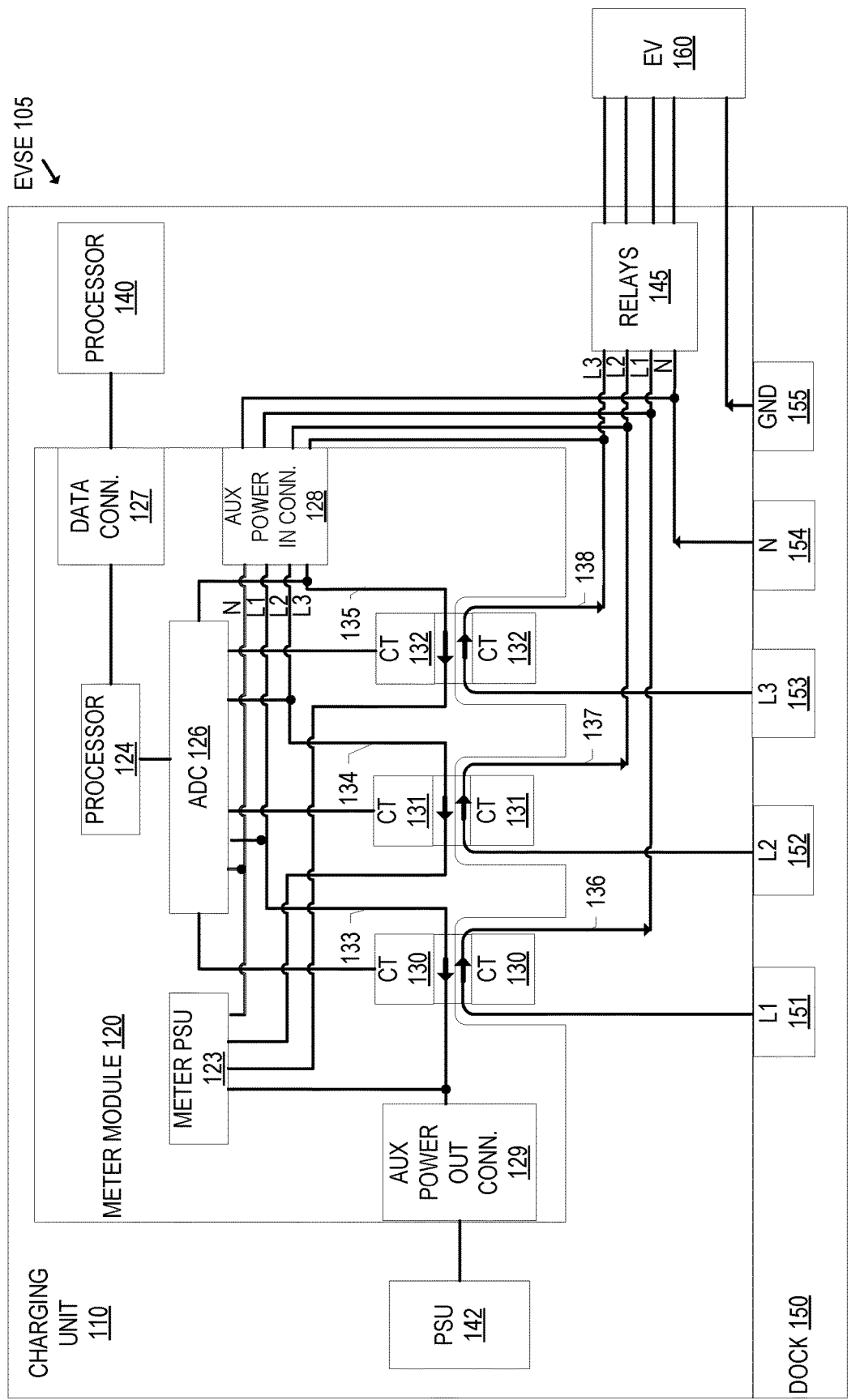
FIG. 1 illustrates an exemplary system that uses an integrated meter according to an embodiment.

FIG. 1 illustrates an exemplary system that uses an integrated meter according to an embodiment. FIG. 1 illustrates an EVSE 105 that includes a charging unit 110 and a dock 150. The charging unit 110 includes a meter module 120, a power supply unit 142, a processor 140, and relays 145. The power supply unit 142, the processor 140, and the relays 145 are used for providing charging functionality for an EV such as the EV 160. The term relay as used herein includes contactors and/or other types of suitable electrically operated switches. Other components may also be included in the EVSE 105 and/or charging unit 110 such as a receptacle, circuitry for a wired EV charging connection, circuitry for a wireless EV charging connection, a charging cable, communication modules (e.g., wired or wireless communication), safety modules, display, and/or external lights.

The meter module 120 includes all the electronics to provide energy measurements for the charging unit 110. The meter module 120 can also provide voltage, current, and/or power measurements. The meter module 120 transmits the measurements to the charging unit 110 (e.g., through a digital interface). In an embodiment, the meter module 120 is compliant with a measurement standard or directive such as the MID 2014/32/EU. Unlike conventional off the shelf meters, the meter module 120 does not have terminals for wired connections and is assembled into the charging unit 110 without any manual wired connections. This allows the meter module 120 to be installed faster and easier compared to conventional meters.

The meter module 120 includes a meter power supply unit (PSU) 123, a processor 124, an analog to digital converter (ADC) 126, a data connector 127, an auxiliary power in connector 128, an auxiliary power out connector 129, and current transformer (CT) coils 130, 131, and 132. The data connector 127 connects to the processor 140 of the charging unit 110. The data connector 127 is used as the interface for communicating energy readings (kWh) and optionally current, voltage, and/or power measurements to the charging unit 110. The auxiliary power in connector 128 connects to the ADC 126, the meter PSU 123, and the auxiliary power out connector 129. The auxiliary power out connector 129 connects to the power supply unit 142 of the charging unit 110. The charging unit 110 may include other components such as a display, an LED, an isolation component, or other components. The data connector 127, the auxiliary power in connector 128, and the auxiliary power out connector 129 may be implemented with pogo pins (spring contacts that connect with a pad on the opposing board) or board-to-board connectors.

The dock 150 is where the AC field wiring connections are made to an external power source. The power source may supply, for example, 400 VAC/480 VAC, 3 phase. The power source may be a power grid. The dock 150 includes input terminals for connecting to the external power source. As illustrated in FIG. 1, the dock 150 includes an L1 input terminal 151, an L2 input terminal 152, an L3 input terminal 153, a neutral input terminal 154, and a ground input terminal 155. The dock 150 can accept directly connected field wiring to the input terminals. Alternatively, the dock 150 may be configured with a plug for connection into a pre-wired outlet. During assembly, the charging unit 110 is fitted with the dock 150. AC power is passed through the dock 150 to the charging unit 110.

In the case of metering EV charging, the main current from the external power source passes through openings of the meter module 120 that are surrounded by the current transformer coils 130, 131, and 132. A main path of the current is used for charging the EV 160 and an auxiliary path of the current is used to power the internals of the meter module 120 and the components of the charging unit 110 that are not directly sending power to the connected EV 160. FIG. 1 shows the main path as illustrated with three main loops (loops 136, 137, and 138) that pass through the current transformer coils 130, 131, and 132 (from the L1 input terminal 151, L2 input terminal 152, L3 input terminal 153 respectively), where the direction of the current flows toward the EV 160. FIG. 1 also shows the auxiliary path which passes through the auxiliary power in connector 128. The auxiliary power in connector 128 is electrically connected to the L1 input terminal 151, L2 input terminal 152, L3 input terminal 153, and neutral input terminal 154. The auxiliary path includes three loops (loops 133, 134, and 135) that pass through the current transformer coils 130, 131, and 132 in the opposite direction as the main path (e.g., the direction of the current flows towards the meter PSU 123 and the PSU 142 through the auxiliary power out connector 129). As shown in FIG. 1, only the L1 line is being passed to the auxiliary power out connector 129 due to power needs of the charging unit 110 (if the power needs were greater, L2 and/or L3 could also be passed through the auxiliary power out connector 129). FIG. 1 shows three phases being passed to the meter PSU 123, however there may fewer phases being passed (e.g., one or two) depending on the PSU. Voltage, current (and therefore power), and data are passed between the meter module 120 and the charging unit 110 through board-to-board connections that are made once the meter module 120 is installed. For example, the auxiliary power in connector 128 is used for passing voltage to the ADC 126 for voltage measurements, for passing power to the meter power supply unit 123, and for passing power through the auxiliary power out connector 129 to the power supply unit 142 of the charging unit 110. The auxiliary power out connector 129 is used for passing power for powering the power supply unit 142 of the charging unit 110. Data is passed through a low voltage data interface (the data connector 127) that can be used by the meter module 120 for communicating measurements including energy measurements.

Figure 2:
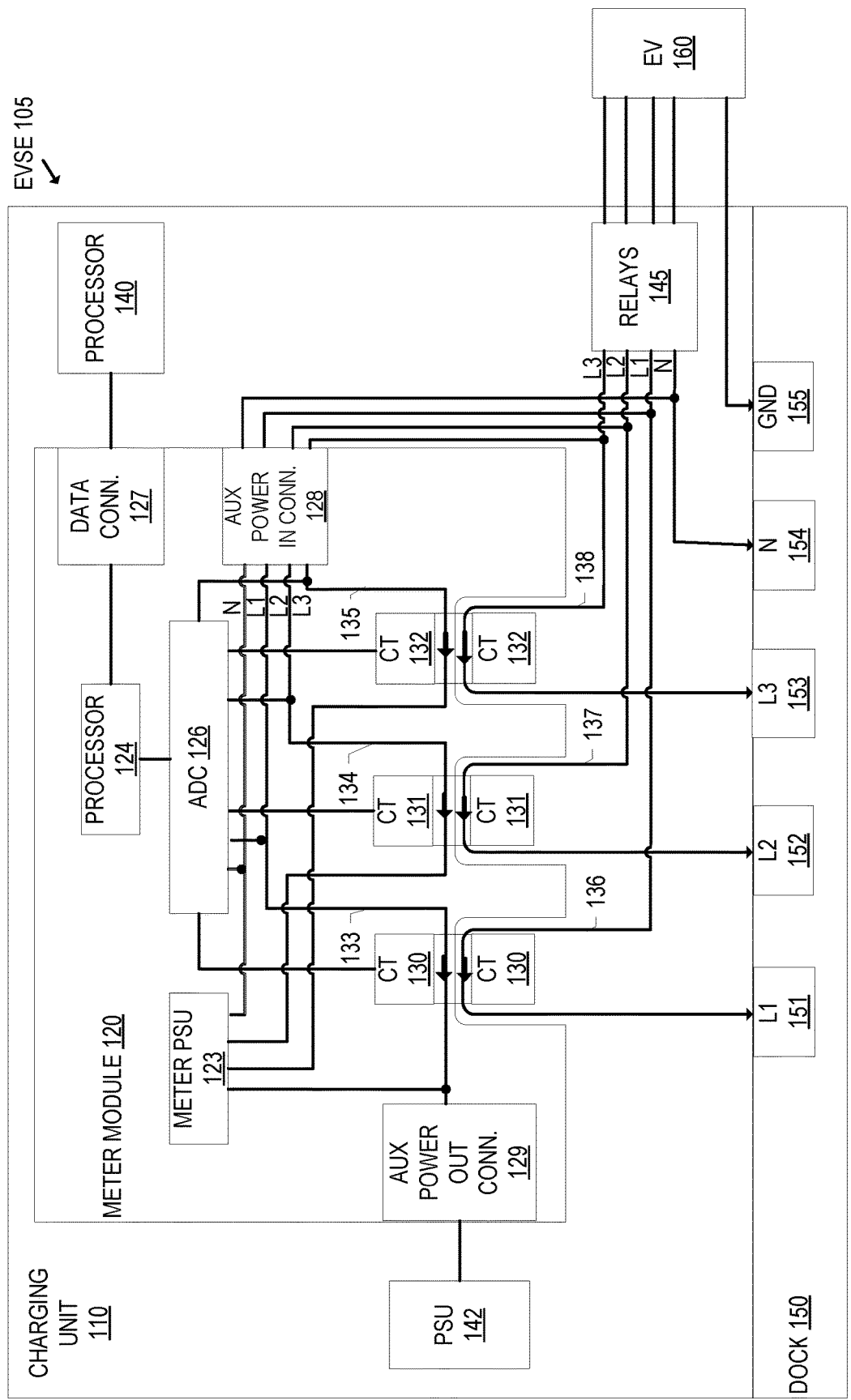
FIG. 2 shows the exemplary system of FIG. 1 in the case the meter is being used for metering from the EV to an external source according to an embodiment.

FIG. 2 shows the exemplary system of FIG. 1 in the case the meter is being used for metering from the EV to an external source (e.g., V2G). In such a case, the main current from the EV 160 passes through the openings of the meter module 120 that are surrounded by the current transformer coils 130, 131, and 132. A first part of the path of the current is used to supply power to the external source and a second part of the path of the current is used to power the internals of the meter module 120 and the components of the charging unit 110. FIG. 2 shows the first part of the path as illustrated with three main loops (loops 136, 137, and 138) that pass through the current transformer coils 130, 131, and 132, where the direction of the current flows toward the L1 input terminal 151, the L2 input terminal 152, and the L3 input terminal 153 respectively. FIG. 2 also shows the second part of the path which passes through the auxiliary power in connector 128. The auxiliary power in connector 128 is electrically connected to the L1 input terminal 151, L2 input terminal 152, L3 input terminal 153, and neutral input terminal 154. The second part of the path includes three loops (loops 133, 134, and 135) that pass through the current transformer coils 130, 131, and 132 towards the meter PSU 123 and the PSU 142 through the auxiliary power out connector 129. Unlike the case of vehicle charging, in the case the meter is being used for metering from the EV to an external source, the direction of the first and second part of the path are the same. As shown in FIG. 2, only the L1 line is being passed to the auxiliary power out connector 129 due to power needs of the charging unit 110 (if the power needs were greater, L2 and/or L3 could also be passed through the auxiliary power out connector 129). FIG. 2 shows three phases being passed to the meter PSU 123, however there may fewer phases being passed (e.g., one or two) depending on the PSU. Voltage, current (and therefore power), and data are passed between the meter module 120 and the charging unit 110 through board-to-board connections that are made once the meter module 120 is installed. For example, the auxiliary power in connector 128 is used for passing voltage to the ADC 126 for voltage measurements, for passing power to the meter power supply unit 123, and for passing power through the auxiliary power out connector 129 to the power supply unit 142 of the charging unit 110. The auxiliary power out connector 129 is used for passing power for powering the power supply unit 142 of the charging unit 110. Data is passed through a low voltage data interface (the data connector 127) that can be used by the meter module 120 for communicating measurements including energy measurements.

The meter module 120 is in a location within the circuitry of the charging unit 110 such that the power for the charging unit 110, the meter module 120, and for charging the EV 160 or for receiving power from the EV 160, runs through current coil(s) of the meter module 120. However, in the case of charging the EV 160, any output to the auxiliary power out connector 129 to the charging unit 110 and to the meter module 120 itself (e.g., to the meter PSU 123) is first passed backwards through the current transformer coils 130, 131, and 132 (e.g., the loops 133, 134, and 135) to ensure that the resultant measured current is for only what is passed to the EV 160 itself and not the background power of the meter module 120 or the charging unit 110. Current consumed by the charging unit 110 and the meter module 120 (as opposed to current consumed by an EV connected to the EVSE) is not measurable by the meter module 120. In the case of receiving power from the EV 160, the output to the auxiliary power out connector 129 to the charging unit 110 and to the meter module 120 itself (e.g., to the meter PSU 123) is passed in the same direction through the current transformer coils 130, 131, and 132 (e.g., the loops 133, 134, and 135) as the main loops (loops 136, 137, and 138). In this case, the meter module 120 measures all the current provided from the EV 160. Thus, the power used by the EVSE and the meter module 120 itself is not subtracted from the energy measurements.

The meter module 120 performs current and voltage measurements and transmits them via a digital interface (e.g., the data connector 127) to the charging unit 110. For example, the current transformer coils 130, 131, and 132 transform high current to low current that can be measured by the ADC 126 as a voltage. The ADC 126 converts the analog voltage values from the current transformer coils 130, 131, and 132 into digital values. The processor 124 combines the raw values to calculate the final current measurements. For voltage measurements, the ADC 126 converts the analog voltage values received from the connection to the auxiliary power in connector 128 to digital values. The processor 124 combines the raw values to calculate the final voltage measurements. To create energy measurements, the processor 124 multiples the current and voltage measurement in real-time to create a power measurement. The processor 124 accumulates the power measurements over time to create an energy measurement. The ADC 126 can also include any upstream conditioning of the inputs (e.g., filters, voltage dividers). The processor 124 causes the measurements (e.g., the energy measurements, current measurements, voltage measurements, and/or power measurements) to be transmitted to the processor 140 through the data connector 127.

The meter module 120 may store information including metering and/or measured data. For instance, the meter module 120 may include physical memory that stores information such as the current measurement, voltage measurement, power measurement, and/or energy measurement. The information can be signed (e.g., by the meter module 120) and transmitted to the charging unit 110. In addition to, or in lieu of signing the data, the data can also be encrypted before transmitting to the external component.

The meter module 120 may be submitted for approval or compliance (e.g., MID compliance) independently of the charging unit 110. Once it is approved, it can be installed into the EVSE. In an embodiment, the housing surrounding the meter module 120 may provide tamper protection. For instance, the tamper detection may detect if the meter module 120 is opened. The tamper detection can take the form of a tilt sensor, light sensor, infrared sensor, acoustic sensor, a lead seal, or a sticker. In an embodiment, detection of a tamper attempt can trigger erasure of data on the meter module 120. The meter module 120 may be calibrated and sealed in the factory.

Figure 3:
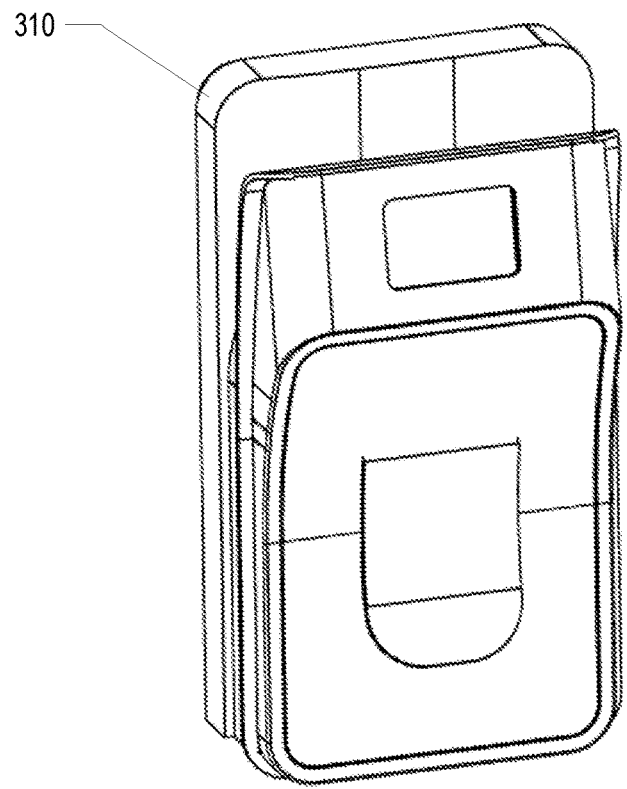
FIG. 3 shows an exemplary EVSE that includes the meter module according to an embodiment.
Figure 4:
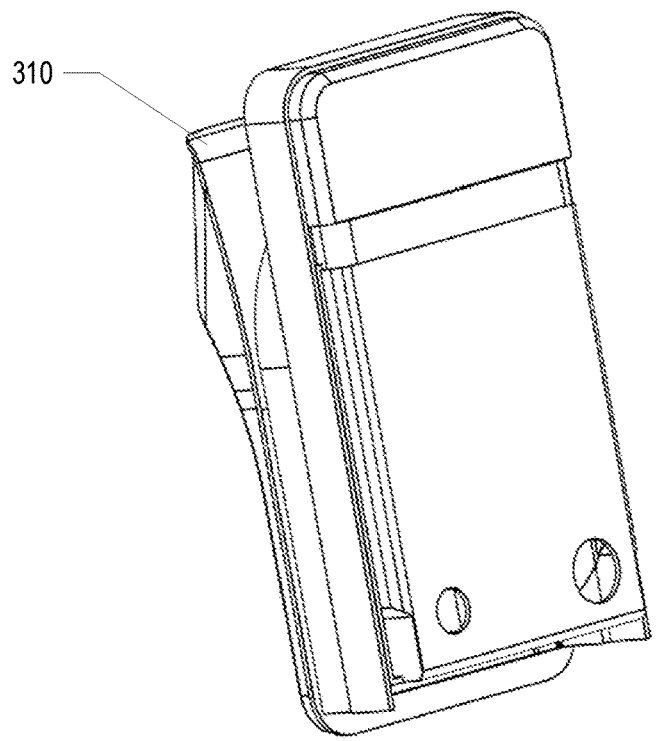
FIG. 4 shows the back side of the EVSE of FIG. 3 according to an embodiment.

FIG. 3 shows an exemplary EVSE 310 that includes the meter module 120 according to an embodiment and FIG. 4 shows the back side of the EVSE of FIG. 3. The form of the EVSE shown in the figures is exemplary and the meter module described herein can be included in different form factors of EVSE.

Figure 5:
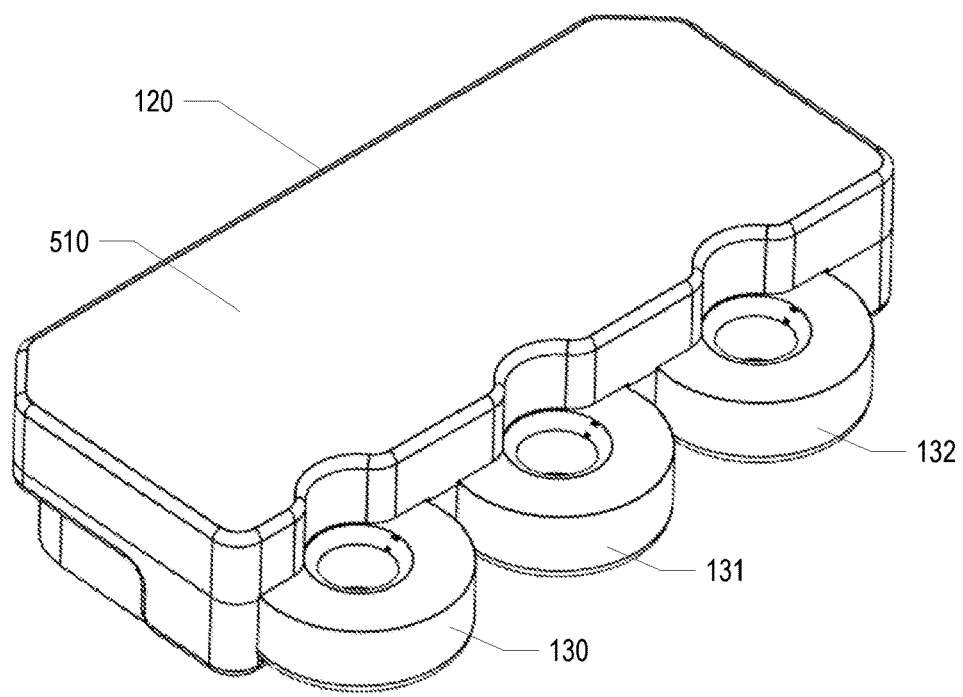
FIG. 5 shows one side of the meter module according to an embodiment.
Figure 6:
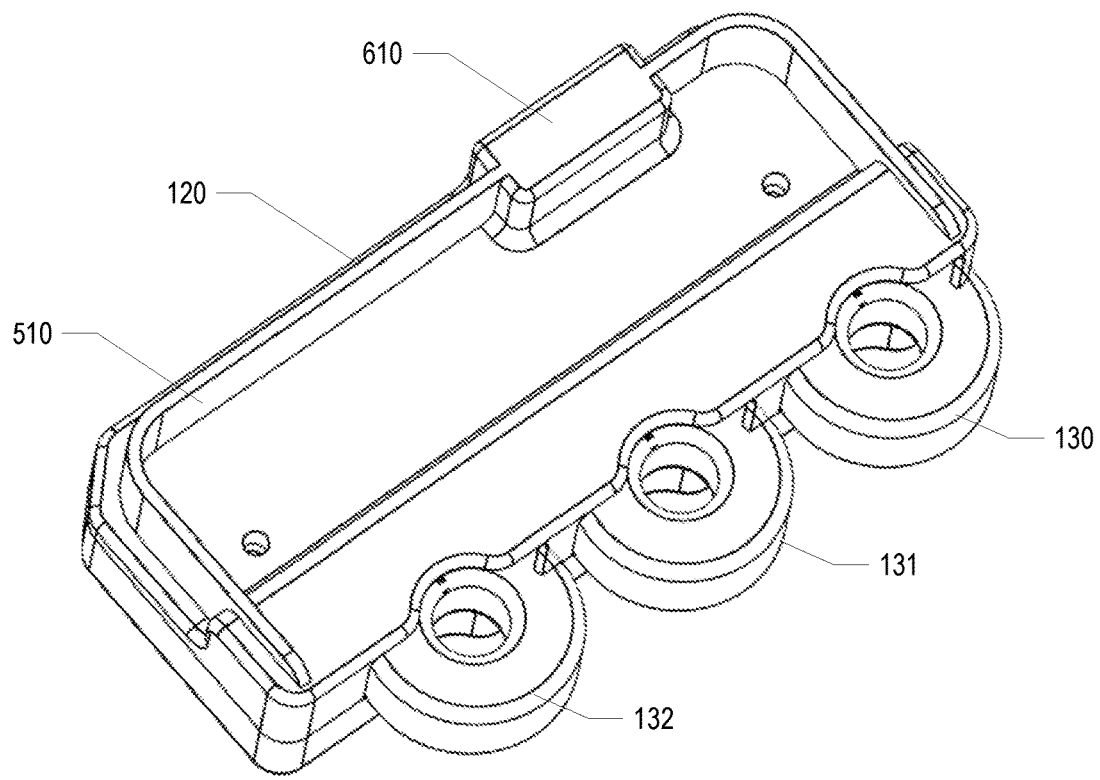
FIG. 6 shows another side of the meter module according to an embodiment.

FIG. 5 shows one side of the meter module 120 and FIG. 6 shows another side of the meter module 120 according to an embodiment. The meter module 120 is included in a housing 510. The housing 510 may provide tamper protection as described herein. Also shown in FIGS. 5 and 5 are the CT coils 130-132. The CT coils 130-132 have openings through which the main current passes. The CT coils 130-132 are shown in a toroidal shape. However, the CT coils 130-132 can be in any magnetically valid shape including a square, rectangle, oval, or other closed loop shape.

FIG. 6 also shows the voltage and data connections (board-to-board) 610 that includes the data connector 127, the auxiliary power in connector 128, and the auxiliary power out connector 129. Although FIG. 6 illustrates a single housing that contains each of these connectors, in another embodiment the connectors may be located in separate housing or some combination of housings.

Figure 7:
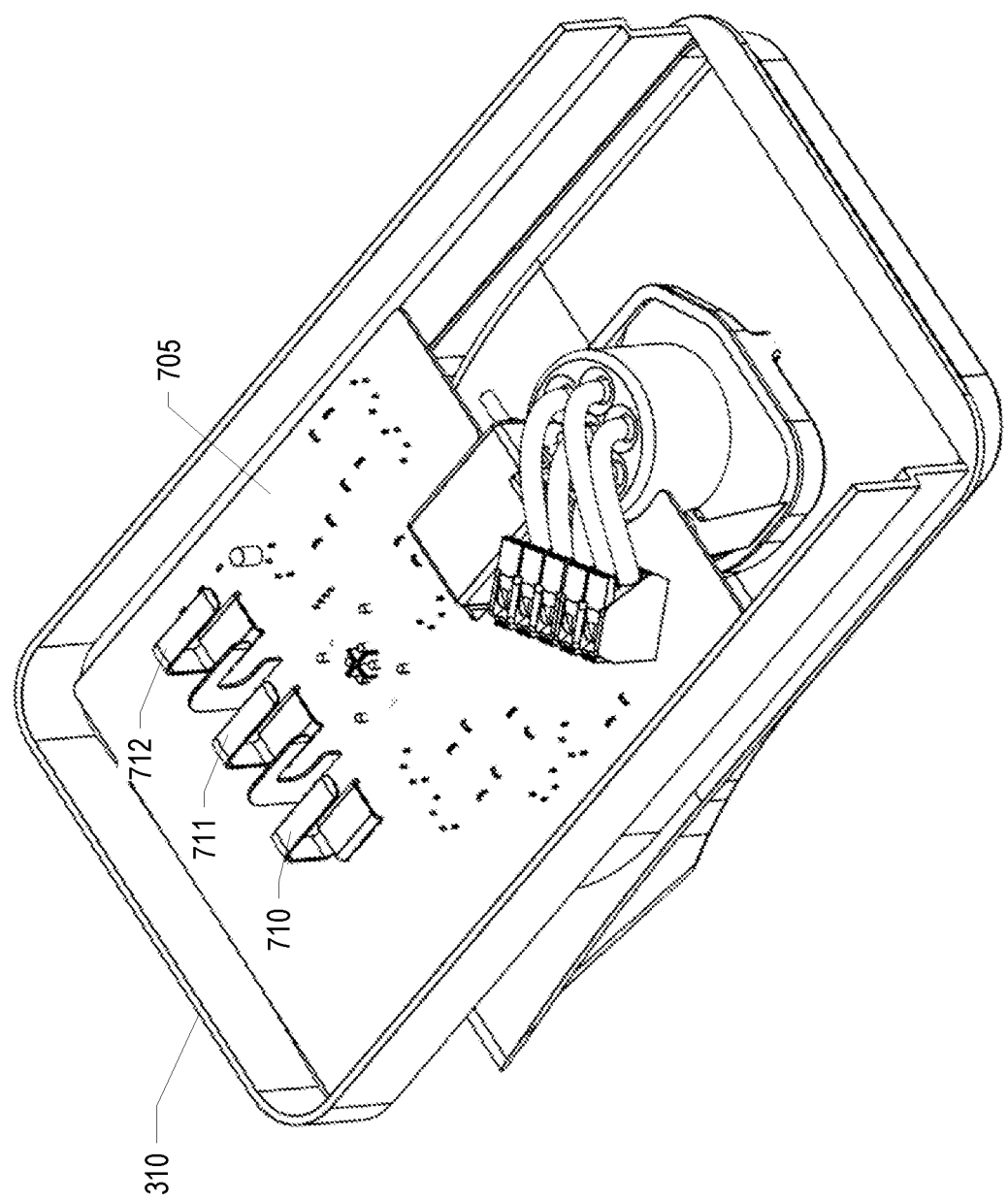
FIG. 7 shows an exemplary view of the EVSE of FIG. 3 that shows some of the internal components of the EVSE according to an embodiment.

FIG. 7 shows an exemplary view of the EVSE of FIG. 3 that shows some of the internal components of the EVSE. Not all the components of the EVSE are shown or described to not obscure understanding. The view of FIG. 7 is without the meter module 120 being installed in the EVSE 310 (e.g., prior to the meter module 120 being installed). The input blades 710, 711, and 712 are electrically connected to the charger circuit board 705 that is part of the charging unit 110. During assembly, the meter module 120 is fitted over the input blades 710, 711, and 712 (e.g., fitted such that the input blades 710, 711, and 712 pass through the openings of the current transformer coils 130, 131, and 132). This allows the meter module 120 to perform current measurements without the current being electrically connected to the meter module 120 itself. Once in place, the meter module 120 is fixed such that the voltage and data connections are made with the charger circuit board 705. Although FIG. 7 shows input blades as the form factor of a conductor, other types of conductors may be used such as pin and barrels or wires.

Figure 8:
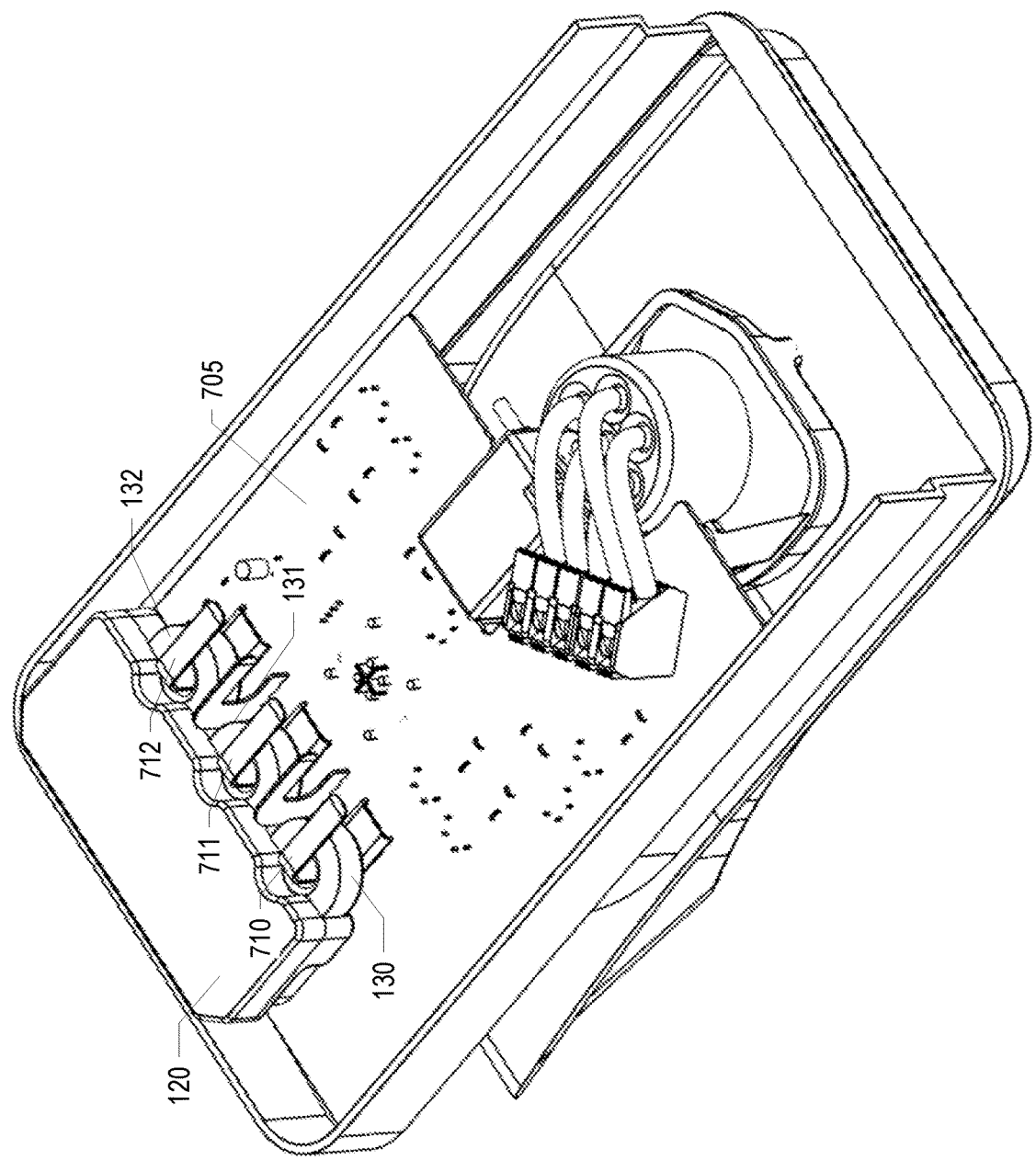
FIG. 8 shows the same view of the EVSE as FIG. 7 and shows the meter module installed according to an embodiment.
Figure 9:
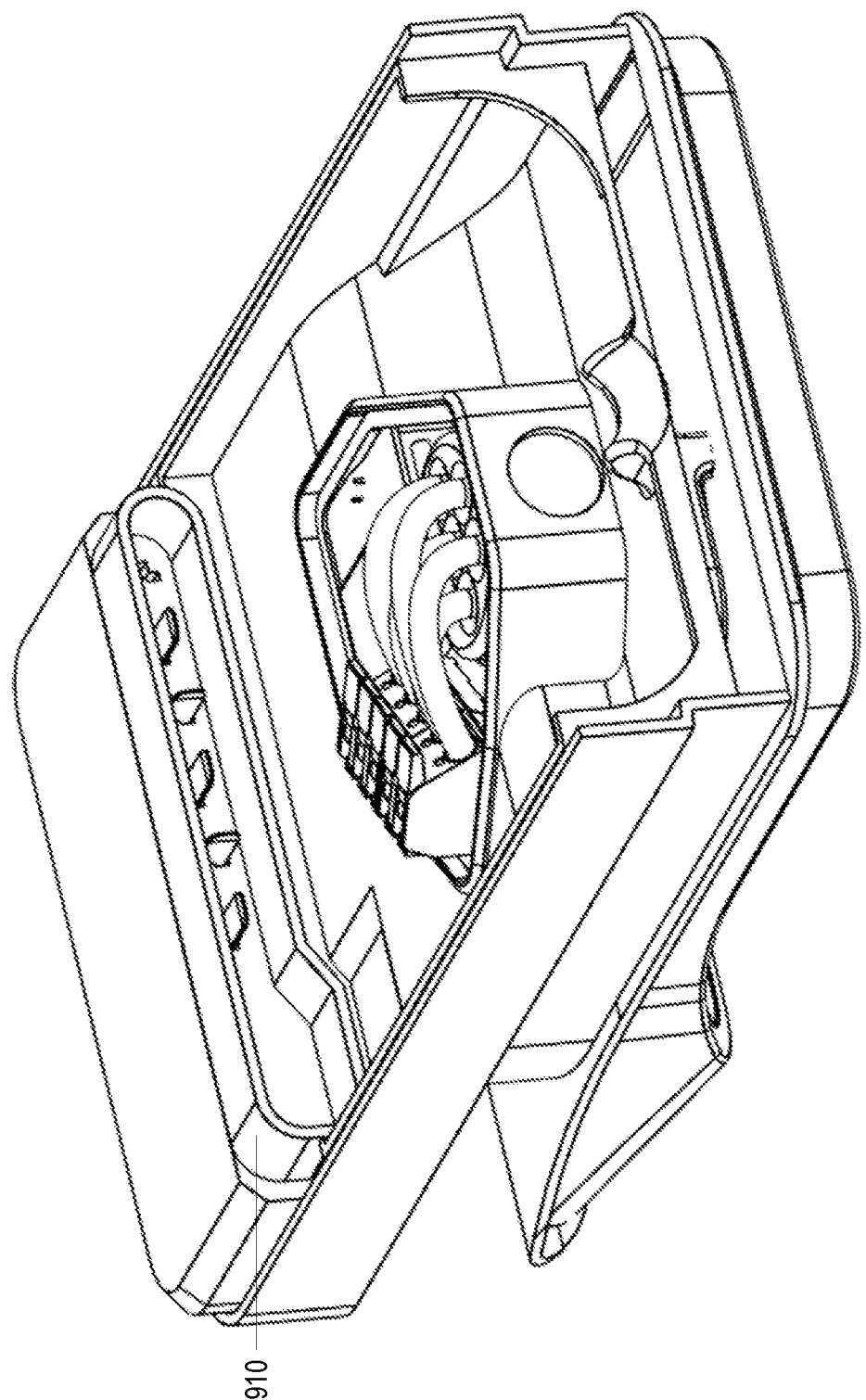
FIG. 9 shows the same view of the EVSE as FIG. 8 and shows the input blade connectors that are built into housings to create a connector that mates with a plate of the EVSE according to an embodiment.

FIG. 8 shows the same view of the EVSE as FIG. 7 and shows the meter module 120 installed in the EVSE 310. The input blades 710, 711, and 712 are fitted in the openings of the current transformer coils 130, 131, and 132 respectively. The meter module 120 is fixed such that the voltage and data connections are made with the charger circuit board 705. FIG. 9 shows the same view of the EVSE as FIG. 8 and shows the input blade connectors that are built into housings to create a connector 910 that mates with a plate of the EVSE 310, shown more in detail in FIG. 10 that shows the connector 910 mounted to a charger mounting plate (the dock 150) of the EVSE 310 and the AC input terminals 1010. The AC input terminals 1010 include the L1 input terminal 151, L2 input terminal 152, L3 input terminal 153, neutral input terminal 154, and the ground input terminal 155.

Figure 11:
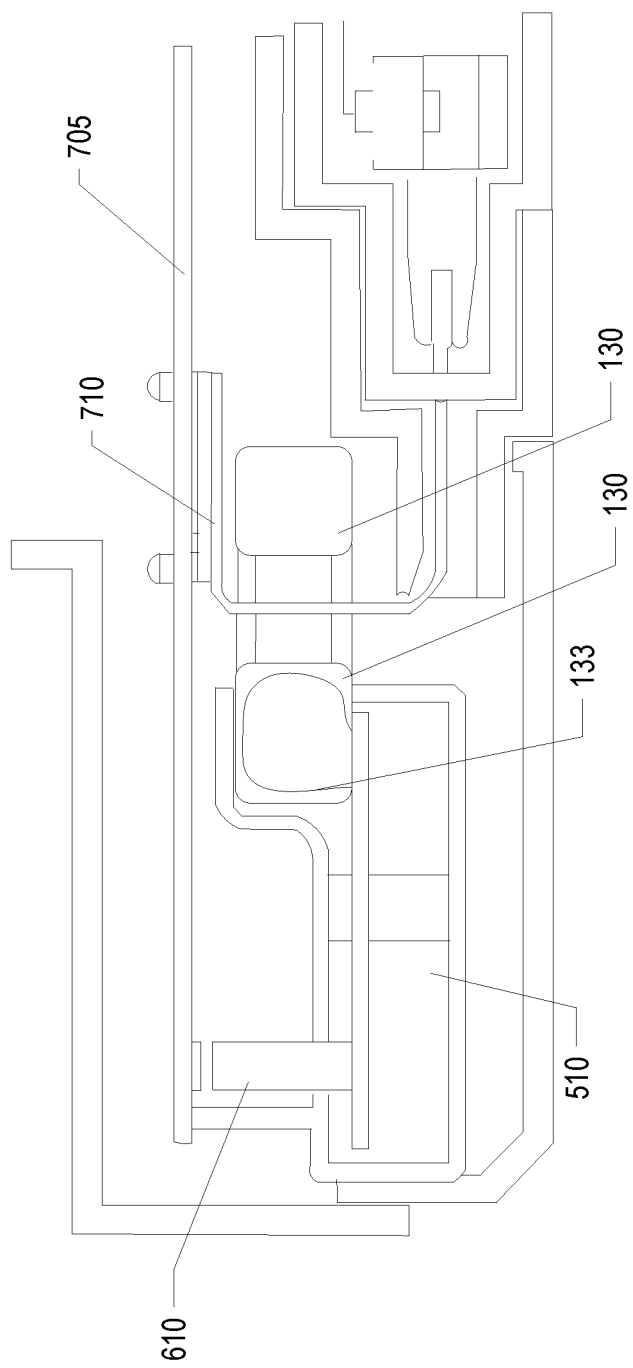
FIG. 11 shows a cross-section of the charging unit, the meter module, and the dock according to an embodiment.

FIG. 11 shows a cross-section of the charging unit 110, the meter module 120, and the dock 150 according to an embodiment. The input blade 710 is shown going through the opening of the current transformer coil 130. Also shown in FIG. 11 is a current loop 133. In the case of EV charging, the current loop 133 is an auxiliary loop where current runs backwards through the current transformer coil 130 and then to the meter PSU 123 and the power supply unit 142 of the charging unit 110. In the case of receiving power from the EV, the current loop 133 carries current that runs through the current transformer coil 130 and then to the meter PSU 123 and the power supply unit 142 of the charging unit 110 in the same direction as the main loop. Although FIG. 11 shows one current loop due to the cross-section, there is a separate current loop for each phase being measured and thus a separate current loop for the current transformer coils 130, 131, and 132 (the current loops 133, 134, and 135). All power required for the internal power supply unit 123 of the meter module 120 and for the power supply unit 142 of the charging unit 110 are passed through these auxiliary loops. The current loops 133, 134, and 135 are within the envelope of the meter module 120. Each current loop may be a wire that is carrying mains AC at low current. In a single-phase implementation, there may be only a single current loop.

Figure 12:
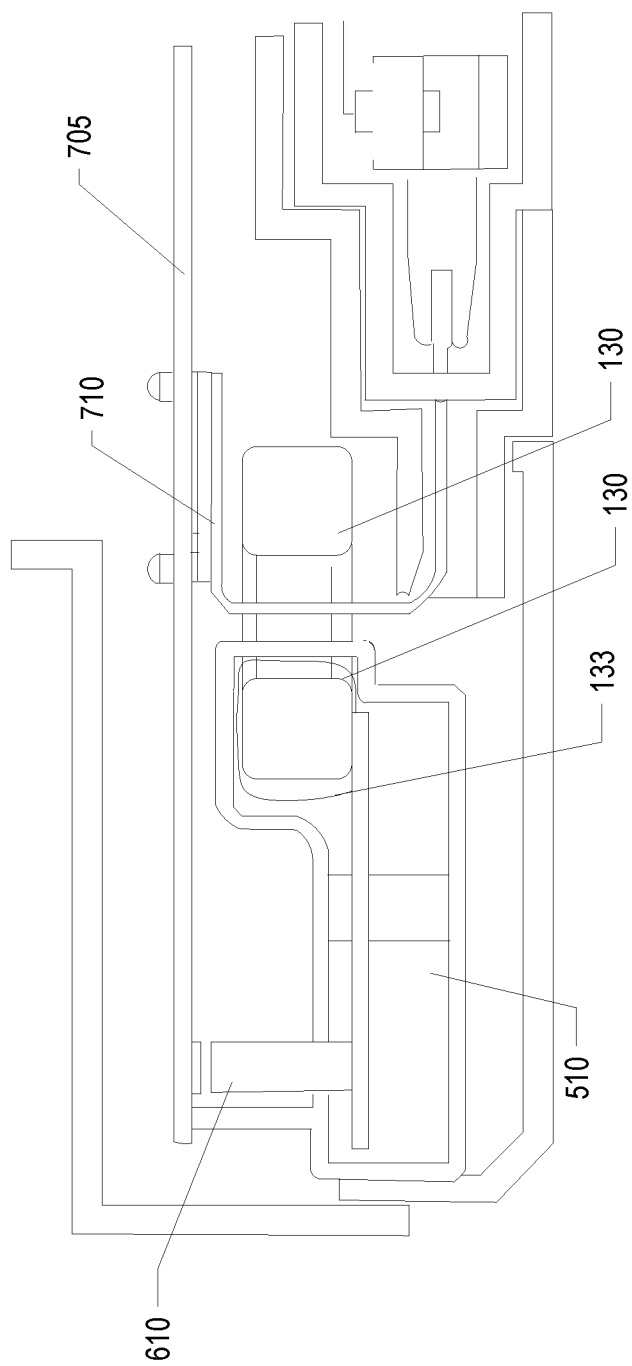
FIG. 12 shows a cross-section of the charging unit and the meter module where the walls of the meter housing extend through the opening of the current transformer coil and the reverse current loop is located outside of the current transformer coil while still within the envelope of the meter module.

In an embodiment, the current loops 133, 134, and 135 are integrated into the current transformer coils 130, 131, and 132. For example, and as shown in FIG. 11, the current loop 133 is integrated into the current transformer coil 130 (e.g., within the overmold (or potting) of the current transformer coil 130). In another embodiment, the current loops 133, 134, and 135 are not integrated into the current transformer coils 130, 131, and 132 but are still within the envelope of the meter module 120. For example, FIG. 12 shows a cross-section of the charging unit 110 and the meter module 120 where the walls of the meter housing 510 extend through the opening of the current transformer coil 130 and the current loop 133 is located outside of the current transformer coil 130 while still within the envelope of the meter module 120.

Figure 13:
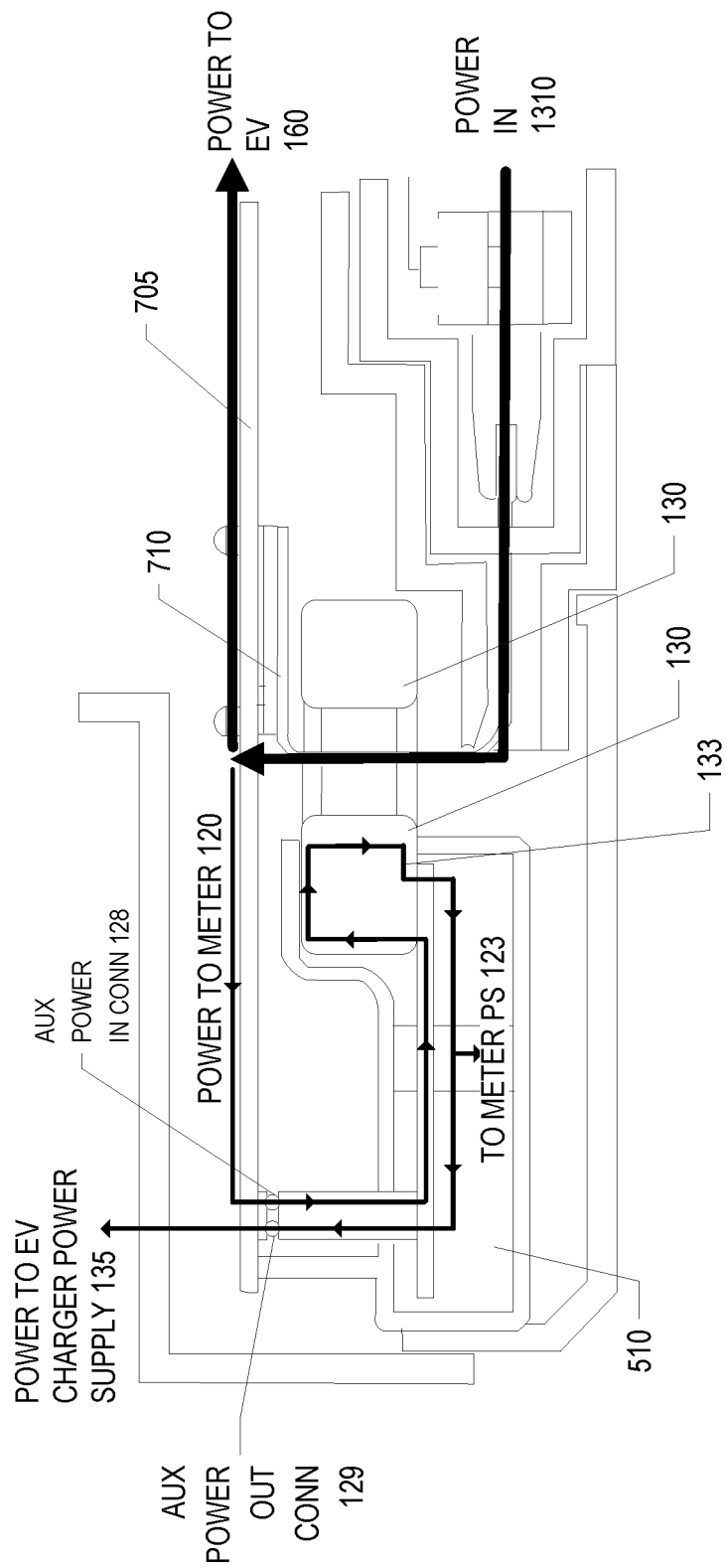
FIG. 13 shows the power path overlay according to an embodiment.

FIG. 13 shows the power path overlay according to an embodiment. The embodiment in FIG. 13 is for the case of charging an EV. The power path includes a main path and an auxiliary path. The main path and the auxiliary path both include the input power 1310 passing from the AC input terminals through the input blades (e.g., 710, 711, and 712) and through the openings of the current transformer coils (e.g., 130, 131, and 132). The paths split where the main path passes towards the connected electric vehicle 160 and the auxiliary path passes towards the meter module 120 through low current connections (e.g., the auxiliary power in connector 128). The main path also includes other components of the charging unit 110 such as the relays 145.

The power of the auxiliary path passes to the meter module 120 through the auxiliary power in connector 128 and runs backwards through the current transformer coils 130, 131, and 132, to the meter power supply unit 123, and to the power supply unit 142 of the charging unit 110 through the auxiliary power out connector 129. Thus, the auxiliary path feeds the meter power supply unit 123 and all EV charger functions that are not directly sending power to the connected EV 160. The auxiliary path of FIG. 13 ensures that the resultant current measured by the meter module 120 is for only what is passed to the EV itself and not the power of the meter module 120 or the charging unit 110. To say it another way, the current entering the meter module 120 passes back through the current transformer coils 130, 131, and 132 thereby offsetting the current measurements and removing any non-EV current from the current measurements. The meter module 120 performs measurements (e.g., energy measurements, current measurements, and/or voltage measurements) and transmits them via a digital interface to the charging unit 110.

The meter module 120 shown in the figures is designed to be used in a three-phase electrical system where there are separate current transformer coils for line 1, line 2, and line 3. However, a similar meter module can be used in a single-phase electrical system. In a single-phase implementation, there may be only one current transformer coil and one input blade.

Figure 14:
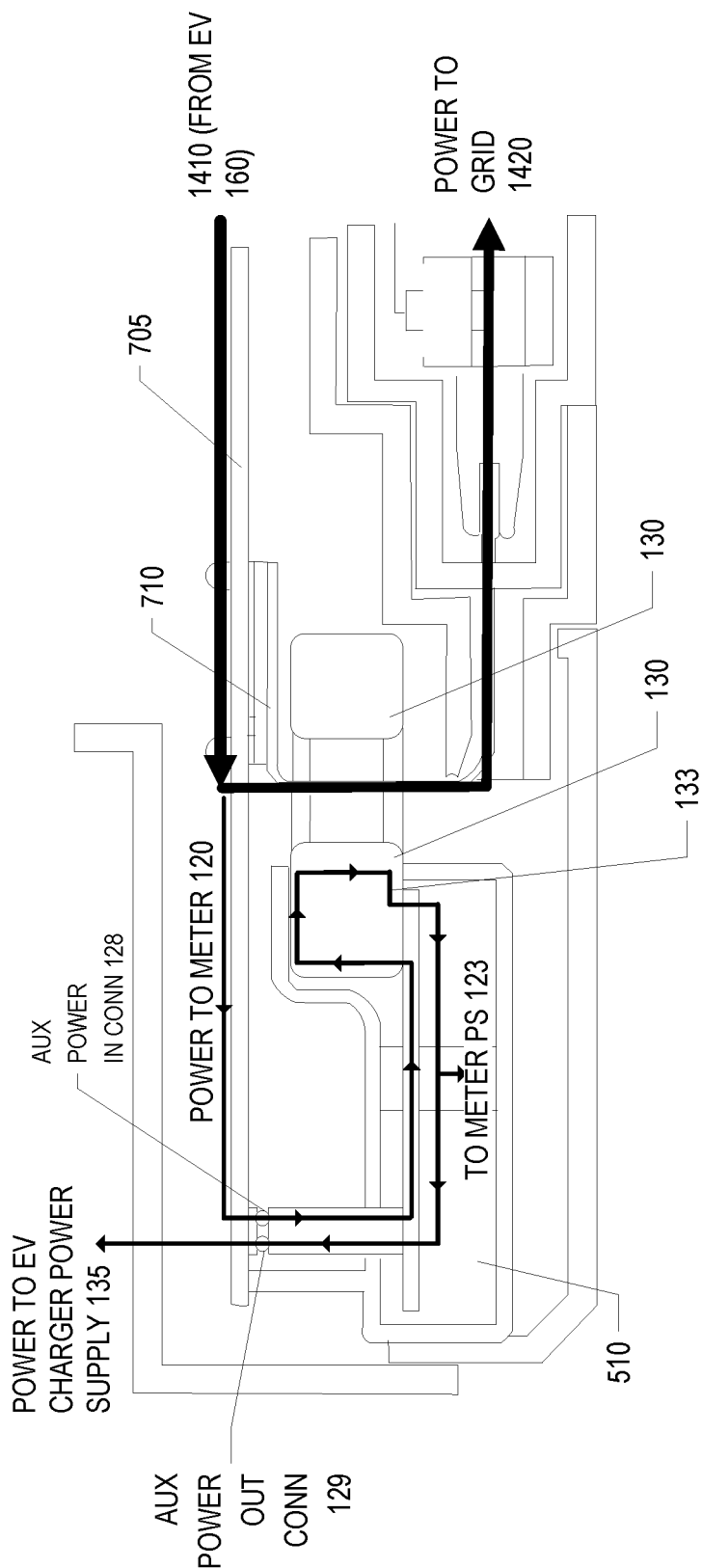
FIG. 14 shows the power path overlay according to an embodiment where power is being received from an EV (e.g., a V2G case) according to an embodiment.

FIG. 14 shows the power path overlay according to an embodiment where power is being received from an EV (e.g., a V2G case). The power path includes a first part of the path and a second part of the path. The power path includes the input power 1410 passing from the connected electric vehicle 160. The first part of the path passes toward the external power source (power to grid 1420) through the openings of the current transformer coils (e.g., 130, 131, and 132) toward the AC input terminals through the input blades (e.g., 710, 711, and 712). The second part of the path passes towards the meter module 120 through low current connections (e.g., the auxiliary power in connector 128). The first part of the path also includes other components of the charging unit 110 such as the relays 145.

The power of the second part of the path passes to the meter module 120 through the auxiliary power in connector 128 and runs through the current transformer coils 130, 131, and 132, to the meter power supply unit 123, and to the power supply unit 142 of the charging unit 110 through the auxiliary power out connector 129. Thus, the second part of the path feeds the meter power supply unit 123 and all EV charger functions that are not directly sending power to the connected EV 160. The path of FIG. 14 ensures that the resultant current measured by the meter module 120 includes all the current from the EV 160. The meter module 120 performs measurements (e.g., energy measurements, current measurements, and/or voltage measurements) and transmits them via a digital interface to the charging unit 110.

Figure 15:
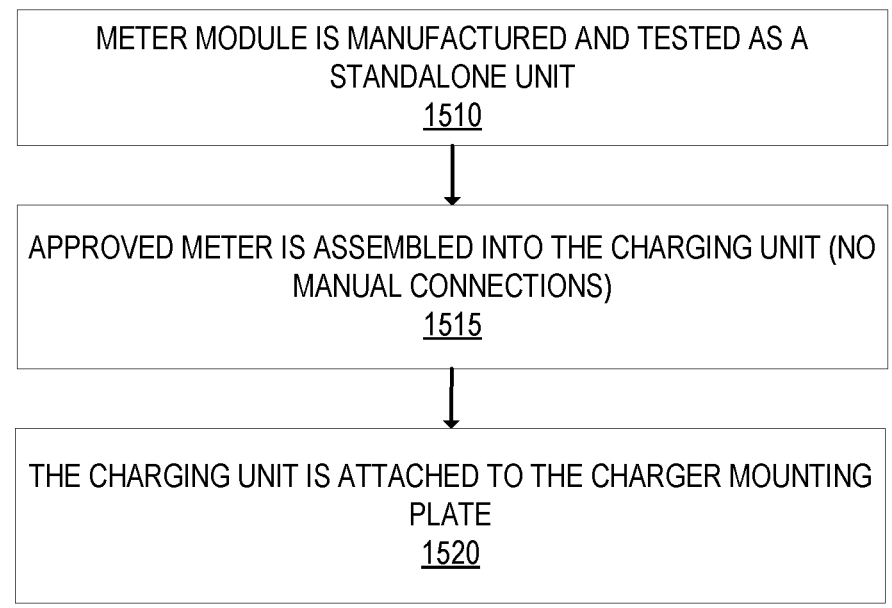
FIG. 15 is a flow diagram that illustrates a method for installing an integrated meter into an EVSE according to an embodiment.

FIG. 15 is a flow diagram that illustrates a method for installing an integrated meter into an EVSE according to an embodiment. The operations of FIG. 15 are described with respect to the exemplary embodiments of the other Figures. However, the operations of FIG. 15 can be performed by different embodiments from that of the other Figures, and the embodiments of the other Figures can perform operations different from the operations of FIG. 15.

At operation 1510, the meter module 120 is manufactured and tested as a standalone unit. The meter module 120 may be submitted for approval or compliance independently of the EVSE. This reduces the complexity of the approval process as compared to approving the full EVSE. For instance, if the full EVSE must be submitted for approval, it may be required to be manufactured in an approved facility. Further, the complete unit may require extensive end of line testing where any failures can cause the entire product to be reworked. In an embodiment, the meter module 120 includes tamper protection as described herein.

Next, at operation 1515, the approved meter module 120 is assembled into the charging unit 110. The assembly does not require any manual wired connections to be made. Assembling includes mounting the meter module 120 into the correct place over the input blades 710, 711, and 712 of the charger circuit board 705 as shown in FIG. 8. Assembling also includes adding housing moldings that form the connector geometry. For example, the input blades 710, 711, and 712 are shrouded in plastic to create the connector 910 that mates with the charging mounting plate (e.g., the dock 150).

Figure 10:
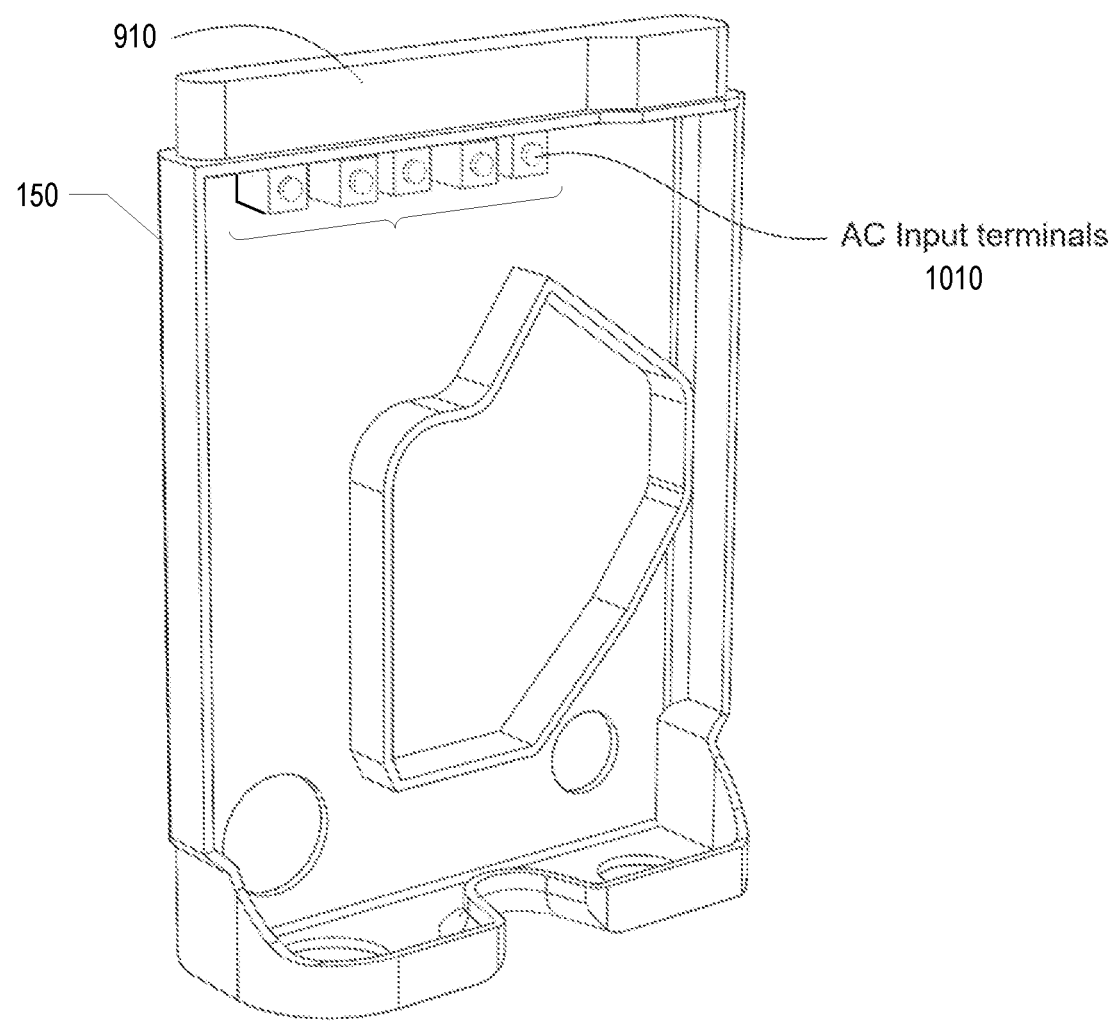
FIG. 10 shows the connector mounted to a charger mounting plate of the EVSE and the AC input terminals according to an embodiment.

Next, at operation 1520, the charging unit 110 is fitted onto the charging mounting plate (e.g., the dock 150) such as shown in FIG. 10. Power can now be passed from the connection from the charging mounting plate to the input blades 710, 711, 712 of the charger circuit board 705.

Figure 16:
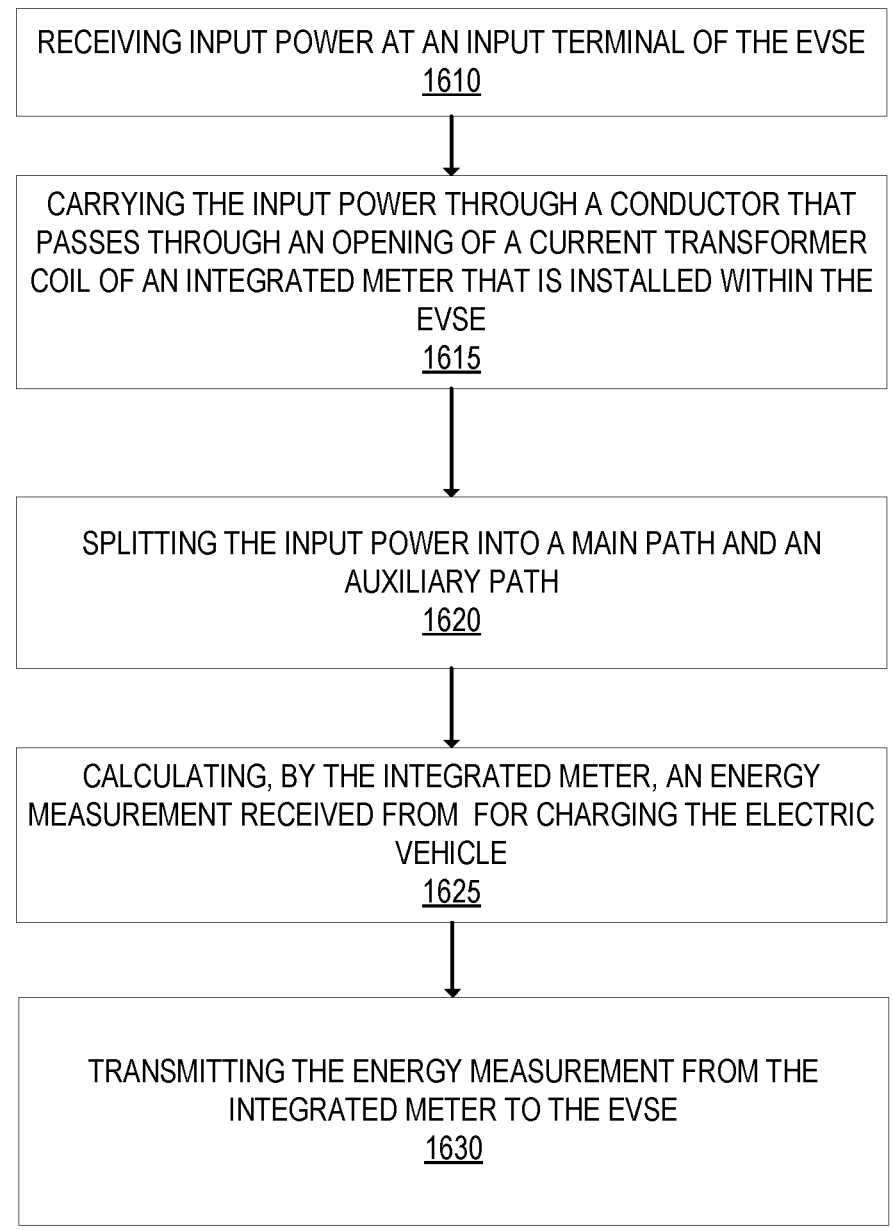
FIG. 16 is a flow diagram that illustrates exemplary operations for metering in an EVSE according to an embodiment.

FIG. 16 is a flow diagram that illustrates exemplary operations for metering in an EVSE according to an embodiment. The operations of FIG. 16 are described with respect to the exemplary embodiments of the other Figures. However, the operations of FIG. 16 can be performed by different embodiments from that of the other Figures, and the embodiments of the other Figures can perform operations different from the operations of FIG. 16.

At operation 1610, input power is received at input terminals of the EVSE. The input power may be received from a power source that is supplying, for example, 400 VAC/480 VAC, 3 phase. Next, at operation 1615, the input power is carried through one or more conductors (e.g., the input blades 710, 711, and 712) that passes through an opening of one or more current transformer coils (e.g., the CT coils 130, 131, and 132) of the meter module 120 that is installed within the EVSE.

Next, at operation 1620, the input power is split into a main path and an auxiliary path. The main path is used for charging the EV 160 and the auxiliary path provides power to the meter module 120 and provides power to non-EV charging functions of the EVSE that are not sending power for charging the electric vehicle. The current of the main path passes through the opening of the current transformer coil(s) (e.g., the CT coils 130, 131, and 132) in a first direction (e.g., towards the EV). The auxiliary path passes through low current connections (e.g., the auxiliary power in connector 128). The current of the auxiliary path passes back through the opening of the current transformer coil(s) (e.g., the CT coils 130, 131, and 132) in a second direction (the reverse direction as the first direction) before being passed to a power supply unit 123 of the meter module 120 and before being passed to a power supply unit 142 of the EVSE. Because the current of the auxiliary path passes through the CT coil(s) in a reverse direction as compared to the current of the main path, and the current of the auxiliary path includes all non-EV charging current, the current sensed by the CT coil(s) only include the current that the EV consumes. Thus, any current not for charging the EV 160 is not included in current measurements from the CT coil(s).

Next, at operation 1625, the meter module 120 calculates an energy measurement for charging the EV 160. The meter module 120 measures current and voltage (where the current measurements do not include current that is not for charging the EV 160), multiplies and integrates them to calculate the energy measurement. At operation 1630, the energy measurement is transmitted from the meter module 120 to the EVSE (e.g., through the data connector 127). Power measurements, voltage measurements, and/or current measurements may be transmitted from the meter module 120 to the EVSE (e.g., through the data connector 127).

Figure 17:
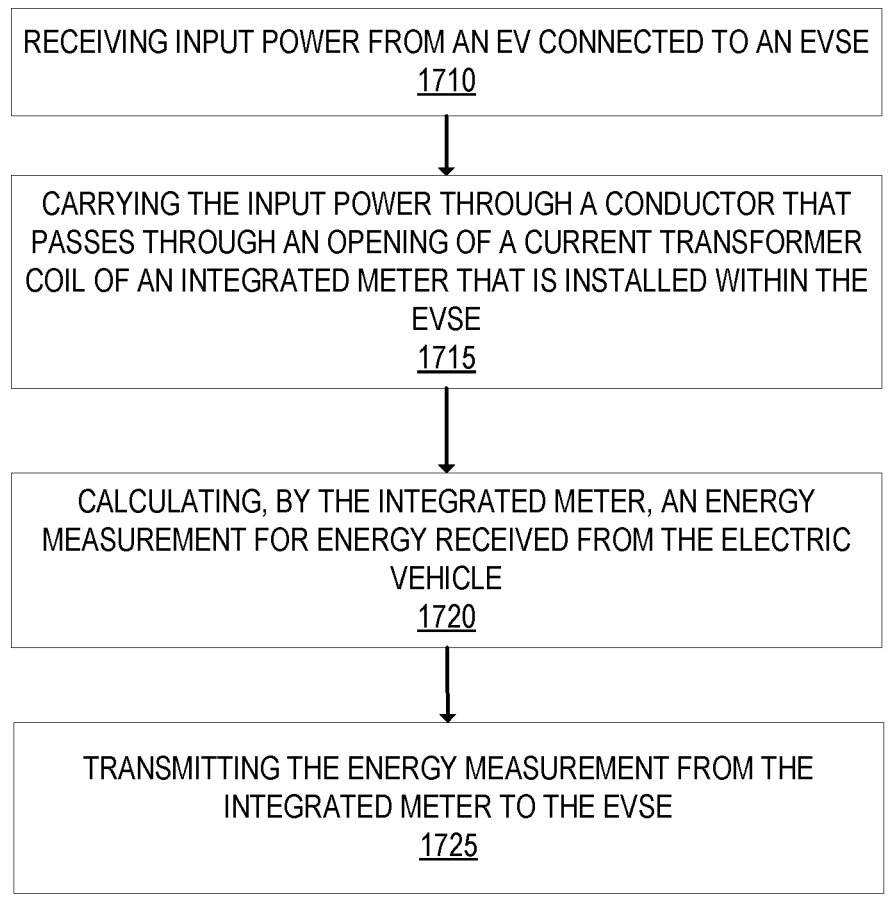
FIG. 17 is a flow diagram that illustrates exemplary operations for metering in an EVSE according to an embodiment.

FIG. 17 is a flow diagram that illustrates exemplary operations for metering in an EVSE according to an embodiment. The operations of FIG. 17 are described with respect to the exemplary embodiments of the other Figures. However, the operations of FIG. 17 can be performed by different embodiments from that of the other Figures, and the embodiments of the other Figures can perform operations different from the operations of FIG. 17. In the embodiment of FIG. 17, an electric vehicle is using the EVSE to provide energy to an external power source.

At operation 1710, input power is received from an electric vehicle connected to the EVSE. The input power may be received over a charging cable connecting the electric vehicle and the EVSE. Next, at operation 1715, the input power is carried through one or more conductors (e.g., the input blades 710, 711, and 712) that passes through an opening of one or more current transformer coils (e.g., the CT coils 130, 131, and 132) of the meter module 120 that is installed within the EVSE. A first part of the power path is used to supply power to the external power source and a second part of the power path is used to provide power to the meter module 120 and provides power to non-EV charging functions of the EVSE. The current of the first part of the path passes through the opening of the current transformer coil(s) (e.g., the CT coils 130, 131, and 132) towards the external power source. The second part of the path passes through low current connections (e.g., the auxiliary power in connector 128). The current of the second part of the path of the auxiliary path passes through the opening of the current transformer coil(s) (e.g., the CT coils 130, 131, and 132) in the same direction as the first part of the path before being passed to a power supply unit 123 of the meter module 120 and before being passed to a power supply unit 142 of the EVSE. Because the current of the first and second part of the path are in the same direction, the current sensed by the CT coil(s) includes the current received from the EV including current that is drawn by the meter and the EVSE.

Next, at operation 1720, the meter module 120 calculates an energy measurement for the energy received from the EV 160. The meter module 120 measures current and voltage multiplies and integrates them to calculate the energy measurement. At operation 1725, the energy measurement is transmitted from the meter module 120 to the EVSE (e.g., through the data connector 127). Power measurements, voltage measurements, and/or current measurements may be transmitted from the meter module 120 to the EVSE (e.g., through the data connector 127).

Embodiments described herein refer to an AC EVSE. A similar meter module can be used if the EVSE supplies DC. In such an embodiment, the CT coils may be changed to DC current sensors such as hall effect or fluxgate sensors. On the AC side of a DC product a similar meter module can be used if the components are scaled for DC use.

Embodiments described herein include the reverse current loop(s) used for offsetting non-EV charging current in current measurements. In another embodiment, such a reverse current loop is not used. In such an implementation, the charging system may not offset the non-EV charging current in current measurements or use other ways of offsetting non-EV charging current.

In the preceding description, numerous specific details such as are set forth to provide a more thorough understanding. It will be appreciated, however, by one skilled in the art that embodiments may be practiced without such specific details. In other instances, control structures, gate level circuits, and/or full software instruction sequences have not been shown in detail to not obscure understanding. Those of ordinary skill in the art, with the included descriptions, will be able to implement appropriate functionality without undue experimentation.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

While several embodiments have been described, those skilled in the art will recognize that the invention is not limited to the embodiments described and can be practiced with modification and alteration within the spirit and scope of the appended claims. The description is thus to be regarded as illustrative instead of limiting.

What is claimed is:

1. An integrated meter to be included in an electric vehicle supply equipment (EVSE), the integrated meter comprising:
    a first power supply unit that supplies power for the integrated meter;
    an auxiliary power out connector that interfaces with a circuit board of the EVSE and that carries power to a second power supply unit of a charging unit of the EVSE;
    an auxiliary power in connector that interfaces with the circuit board of the EVSE and that carries power to the first power supply unit and the second power supply unit through the auxiliary power out connector;
    a current transformer coil that includes an opening that allows input power to be passed through the integrated meter through a conductor, wherein the input power is split into a main path and an auxiliary path, wherein the main path is for charging an electric vehicle connected to the EVSE, wherein the auxiliary path feeds the first power supply unit and the second power supply unit, and wherein power of the auxiliary path passes through the auxiliary power in connector and then the opening of the current transformer coil in reverse before being passed to the first power supply unit and the second power supply unit through the auxiliary power out connector to remove any current not for charging the electric vehicle from current measurements; and
    a processor that calculates energy measurements for charging the electric vehicle connected to the EVSE, wherein the calculated energy measurements for charging the electric vehicle only include current drawn by the electric vehicle.

2. The integrated meter of claim 1, wherein the current transformer coil is a closed shape.

3. The integrated meter of claim 1, wherein the auxiliary path runs within an overmold or potting of the current transformer coil.

4. The integrated meter of claim 1, wherein the auxiliary path runs around the current transformer coil while remaining with a housing of the integrated meter.

5. The integrated meter of claim 1, further comprising:
    a data connector that connects with a processor of the charging unit to pass the energy measurements of the integrated meter to the charging unit.

6. The integrated meter of claim 1, further comprising a housing that contains the first power supply unit, the auxiliary power out connector, the auxiliary power in connector, and the current transformer coil, wherein the integrated meter includes tamper protection.

7. The integrated meter of claim 1, wherein the integrated meter is compliant with a Measuring Instruments Directive (MID).

8. The integrated meter of claim 1, wherein the opening of the current transformer coil further allows power from an electric vehicle to be passed through the integrated meter through the conductor, wherein a first part of the power from the electric vehicle is for providing power to an external power source, wherein a second part of the power from the electric vehicle feeds the first power supply unit and the second power supply unit, wherein the second part of the power passes through the auxiliary power in connector and then the opening of the current transformer coil before being passed to the first power supply unit and the second power supply unit through the auxiliary power out connector, and wherein the processor further calculates energy measurements from power from the electric vehicle.

9. A method for metering in an electric vehicle supply equipment (EVSE), comprising:
receiving input power at input terminals of the EVSE;
carrying the input power through a conductor that passes through an opening of a current transformer coil of an integrated meter that is installed within the EVSE;
splitting the input power that is carried through the conductor that passes through the current transformer coil into a main path and an auxiliary path, wherein the main path is for charging an electric vehicle connected to the EVSE, wherein the auxiliary path provides power to the integrated meter and provides power to non-electric vehicle charging functions of the EVSE that are not sending power for charging the electric vehicle, and wherein the auxiliary path passes through the opening of the current transformer coil in reverse before being passed to a power supply unit of the integrated meter and before being passed to a power supply unit of the EVSE to remove any current not for charging the electric vehicle from current measurements;
calculating, by the integrated meter, an energy measurement for charging the electric vehicle, wherein the energy measurement does not include current drawn by the integrated meter and the EVSE; and
transmitting the energy measurement from the integrated meter to a processor of the EVSE.

10. The method of claim 9, wherein the current transformer coil is a closed shape.

11. The method of claim 9, wherein the auxiliary path runs within an overmold or potting of the current transformer coil.

12. The method of claim 9, wherein the integrated meter includes tamper protection.

13. The method of claim 9, wherein the integrated meter is compliant with a Measuring Instruments Directive (MID).

14. An electric vehicle supply equipment (EVSE), comprising:
a plurality of input terminals for receiving input power;
a conductor for carrying the input power through an opening of a current transformer coil of an integrated meter and out to a set of relays for charging an electric vehicle and to an auxiliary power in connector of the integrated meter;
the integrated meter including:
a first power supply unit that supplies power for the integrated meter,
an auxiliary power out connector that interfaces with a circuit board of the EVSE and that carries power to a second power supply unit of the EVSE,
an auxiliary power in connector that interfaces with the circuit board of the EVSE and that carries power to the first power supply unit and the second power supply unit through the auxiliary power out connector,
the current transformer coil that includes the opening that allows input power to be passed through the integrated meter through the conductor, wherein the input power is split into a main path and an auxiliary path, wherein the main path is for charging the electric vehicle connected to the EVSE, wherein the auxiliary path feeds the first power supply unit and the second power supply unit, and wherein power of the auxiliary path passes through the auxiliary power in connector and then the opening of the current transformer coil in reverse before being passed to the first power supply unit and the second power supply unit through the auxiliary power out connector to remove any current not for charging the electric vehicle from current measurements, and
a processor that calculates energy measurements for charging the electric vehicle connected to the EVSE, wherein the calculated energy measurements for charging the electric vehicle only include current drawn by the electric vehicle; and
the second power supply unit that receives power through the integrated meter.

15. The EVSE of claim 14, wherein the current transformer coil is a closed shape.

16. The EVSE of claim 14, wherein the auxiliary path runs within an overmold or potting of the current transformer coil.

17. The EVSE of claim 14, wherein the auxiliary path runs around the current transformer coil while remaining with a housing of the integrated meter.

18. The EVSE of claim 14, wherein the integrated meter further includes:
a data connector that connects with a processor of the EVSE to pass the energy measurements of the integrated meter to the EVSE.

19. The EVSE of claim 14, wherein the integrated meter is compliant with a Measuring Instruments Directive (MID).

20. The EVSE of claim 14, wherein the opening of the current transformer coil further allows power from an electric vehicle to be passed through the integrated meter through the conductor, wherein a first part of the power from the electric vehicle is for providing power to an external power source, wherein a second part of the power from the electric vehicle feeds the first power supply unit and the second power supply unit, wherein the second part of the power passes through the auxiliary power in connector and then the opening of the current transformer coil before being passed to the first power supply unit and the second power supply unit through the auxiliary power out connector, and wherein the processor further calculates energy measurements from power from the electric vehicle.

* * * * *